(12) United States Patent
Choi et al.

(10) Patent No.: US 7,172,974 B2
(45) Date of Patent: Feb. 6, 2007

(54) METHODS FOR FORMING FINE PATTERN OF SEMICONDUCTOR DEVICE

(75) Inventors: Sang-jun Choi, Seoul (KR); Young-mi Lee, Yongin (KR); Woo-sung Han, Kangnam-gu (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 377 days.

(21) Appl. No.: 10/462,448

(22) Filed: Jun. 16, 2003

(65) Prior Publication Data
US 2004/0082170 A1    Apr. 29, 2004

(30) Foreign Application Priority Data
Oct. 26, 2002   (KR) ..................... 10-2002-0065681

(51) Int. Cl.
*H01L 21/302*   (2006.01)
(52) U.S. Cl. ..................... 438/709; 438/719; 438/725; 438/156
(58) Field of Classification Search ................ 438/709, 438/719, 725, 756
See application file for complete search history.

(56) References Cited

U.S. PATENT DOCUMENTS

| | | | |
|---|---|---|---|
| 6,348,301 B1 * | 2/2002 | Lin | 430/330 |
| 6,486,058 B1 * | 11/2002 | Chun | 438/637 |
| 6,489,085 B2 * | 12/2002 | Huang et al. | 430/322 |
| 6,579,657 B1 * | 6/2003 | Ishibashi et al. | 430/270.1 |
| 6,740,473 B1 * | 5/2004 | Lin et al. | 430/315 |

FOREIGN PATENT DOCUMENTS

| | | |
|---|---|---|
| KR | 1998-0011726 | 4/1998 |
| KR | 1020010076552 | 8/2001 |

OTHER PUBLICATIONS

Wolf et al., Silicon Processing for the VLSI Era, 1986, Lattice Press, vol. 1, pp. 453-454.*

* cited by examiner

*Primary Examiner*—Nadine G. Norton
*Assistant Examiner*—Binh X. Tran
(74) *Attorney, Agent, or Firm*—F. Chau & Associates, LLC

(57) ABSTRACT

Provided is a method for forming a fine pattern of a semiconductor device by controlling the amount of flow of a resist pattern, including forming a resist pattern having a predetermined pattern distance on a material layer to be etched, forming a flow control barrier layer on the resist pattern to control the amount of flow during a subsequent resist flow process and to make the profile of the flowed pattern be vertical, optionally forming the flow control barrier layer by coating a material including a water-soluble high-molecular material and a crosslinking agent on the resist pattern, mixing and baking the coated material layer, and processing the resultant structure using deionized water, carrying out the flow resist process to form a hyperfine pattern and etching the lower material layer, and thereby forming fine patterns having the shape of contact holes or lines and spaces to have a critical dimension of about 100 nm or less, even with use of a KrF resist.

21 Claims, 2 Drawing Sheets

METHODS FOR FORMING FINE PATTERN OF SEMICONDUCTOR DEVICE

BACKGROUND OF THE INVENTION

1. Field of the Invention

The present invention relates to semiconductor devices, and more particularly, to a method for forming fine patterns in semiconductor devices.

2. Description of the Related Art

As the integration density of semiconductor devices has increased, finer patterns have been required. To meet required design rules that become gradually smaller, a variety of new manufacturing techniques are needed, including improvement of a photolithography process. For example, new light sources and photoresist materials suitable therefor are desired, as well as exposure apparatuses capable of using new light sources and photoresist materials. In addition, development of manufacturing processes appropriate for new light sources and related apparatuses to form fine patterns are further desired.

KrF, which is a light source widely used in a photolithography process, is reaching the technical limit for forming much finer patterns because KrF has a longer wavelength than the critical dimension of such patterns, which continue to decrease. Thus, studies of use of lights having shorter wavelengths have been made. As a result, techniques of using ArF gas or F2 gas as a light source have been proposed. In addition, exposure methods and apparatuses using ArF(193 nm) excimer laser or F2(157 nm) excimer laser, which is emitted from new light sources, are presently being developed.

To form fine patterns by applying the ArF excimer laser or F2 excimer laser to practical processes, it is also necessary to develop suitable resist materials and manufacturing processes. As problems with materials and techniques remain unsolved, the new light sources have not yet been applied to practical production lines. Accordingly, research for a combination of other manufacturing techniques using the existing photoresist materials (e.g., KrF resist material) has progressed along with developments in new photoresist materials and techniques that enable application of the new light sources.

A method of using a half tone phase shift mask (HT-PSM) is one technique of forming a fine contact plug using the existing KrF resist material. It is assumed that this method enables formation of a contact hole having a critical dimension of about 150 nm, even when using a KrF resist. However, in the case of using a HT-PSM, it is difficult to manufacture a mask. Also, when the density of a contact hole is high, a side-lobe may be formed. Furthermore, in the method of using HT-PSM, it is practically impossible to form hyperfine patterns such as a contact hole having a critical dimension of 100 nm or less.

Another technique of forming finer patterns using the existing photoresist is a resist flow process. According to the resist flow process, fine patterns, which are smaller than the exposure wavelength limit, can be formed even without changing resist materials or exposure apparatuses. A brief description of the resist flow process will be explained hereinafter.

A resist pattern is formed as a line and space shape or a contact hole shape such that a pattern distance is set to be more than a predetermined value. For instance, a contact hole pattern is formed using a KrF resist to have a diameter of about 180 nm. The contact hole pattern having the diameter of 180 nm can be easily embodied also by the current techniques. Next, the resist pattern is heated for a predetermined amount of time at the glass transition temperature of the photoresist material or higher. Then, flow of the resist occurs and this leads the profile of the resist pattern to inflate. As a result, a distance between patterns is decreased and the diameter of the contact hole is reduced. Based on the foregoing principle, it is feasible to form patterns having a size below the exposure wavelength limit, that is, contact hole patterns of less than 150 nm.

Even so, the resist flow process has several problems, especially when a resist pattern is heated at the high temperature, thus causing plenty of flow. For example, when plenty of flow of the resist occurs, an interfacial profile of the resist pattern may be bent like a bow. That is, a bowing phenomenon occurs. This is because a flow rate may be different according to the position of resist patterns. In other words, a lot of flow is generated at a medium portion of resist patterns while less flow occurs at lower or upper portions thereof. Thus, when a lower layer is etched by using the resist pattern as an etch mask, an etched profile may not be vertical or a desired size of pattern may not be realized due to the bowing phenomenon.

To solve the foregoing problems, a baking process may be carried out through several steps. However, this method may increase process times, thus permitting a drop in yield. Also, if the amount of flow increases, the bowing phenomenon cannot be fundamentally prevented.

Another problem of the resist flow process is that when there is any deviation in the pattern density, the amount of flow may be different depending on the deviation. For example, there may exist a deviation in the duty ratio of a contact hole according to positions due to a difference in the pattern density. Here, the duty ratio refers to the ratio of a distance between adjacent patterns to a pattern size. In the case of logic devices rather than memory devices, the deviation may be very large according to positions. When the deviation is large, if the baking process is performed, more flow occurs at a position where the distance between adjacent patterns is relatively large. As a result, patterns having the desired size cannot be formed and, more seriously, adjacent resist patterns may be connected with each other and thus damaged.

Still another problem of the resist flow process is that when it is desired to cause resist to flow more, as the amount of flow increases, it becomes more difficult to exactly control the amount of flow. In general, even finer patterns can be formed by causing much more flow. However, in the case of the resist flow process, it becomes more difficult to exactly control the desired amount of flow in proportion to the present amount of flow. Therefore, it is considerably troublesome to form uniform and fine patterns.

Consequently, conventional techniques including the resist flow process have a specific technical limit when fine patterns are formed below the exposure wavelength limit. For instance, it is possible to form a contact hole having a critical dimension of about 150 nm by using a KrF resist. But, it is not simple to form hyperfine patterns having a critical dimension of about 120 nm or less, or ultimately about 100 nm or less.

SUMMARY OF THE INVENTION

Accordingly, the present invention provides a method for forming a fine pattern, which has a size below the exposure wavelength limit (e.g., in the case of the presently used KrF resist, 120 nm or less, or ultimately 100 nm or less) by using the existing photoresist materials or new photoresist materials.

The present invention also provides a method for forming a fine pattern that can prevent the bowing phenomenon even when a hyperfine pattern is formed using the resist flow process and that can form a fine pattern having a uniform size even when there exists a deviation in the pattern density.

In accordance with an aspect of the present invention, there is provided a method for forming a fine pattern, the method comprising forming a photoresist layer on a target layer to be etched. The photoresist layer is then exposed and developed to form a first resist pattern. Next, a flow control barrier layer for controlling flow of the first resist pattern during a subsequent resist flow process is formed on the first resist pattern, thereby forming a second resist pattern. The resist flow process is then performed so as to form a third resist pattern having a pattern distance shorter than that of the second resist pattern. The target layer is etched by using the third resist pattern as an etch mask to form a fine pattern.

In accordance with another aspect of the present invention, there is provided a method for forming a fine pattern, the method comprising forming a photoresist layer on a target layer to be etched. The photoresist layer is then exposed and developed to form a first resist pattern. Next, a high-molecular material layer, which is soluble in a specific solvent, is formed on the target layer and the first resist pattern. A flow control barrier layer, which is insoluble in the specific solvent, is formed at an interface between the first resist pattern and the material layer. The flow control barrier layer may control the amount of flow of the first resist pattern during a subsequent resist flow process. The remaining high-molecular material layer is removed using the specific solvent to form a second resist pattern. The resist flow process is carried out to form a third resist pattern with a pattern distance shorter than that of the second resist pattern. The target layer is etched by using the third resist pattern as a mask.

In accordance with yet another aspect of the present invention, there is provided a method for forming a fine pattern, the method comprising forming a photoresist layer on a target layer to be etched. The photoresist layer is exposed and developed to form a first resist pattern. A water-soluble high-molecular material layer is formed on the target layer and the first resist pattern. The material layer is mixed and baked to form a water-insoluble flow control barrier layer at an interface between the first resist pattern and the material layer. The remaining water-soluble high-molecular material layer is removed using deionized water to form a second resist pattern. A resist flow process is carried out to form a third resist pattern having a pattern distance shorter than that of the second resist pattern. The target layer is etched by using the third resist pattern as a mask.

BRIEF DESCRIPTION OF THE DRAWINGS

The above and other features and advantages of the present invention will become more apparent by describing in detail preferred embodiments thereof with reference to the attached drawings, in which.

DETAILED DESCRIPTION OF THE INVENTION

Figure 1:
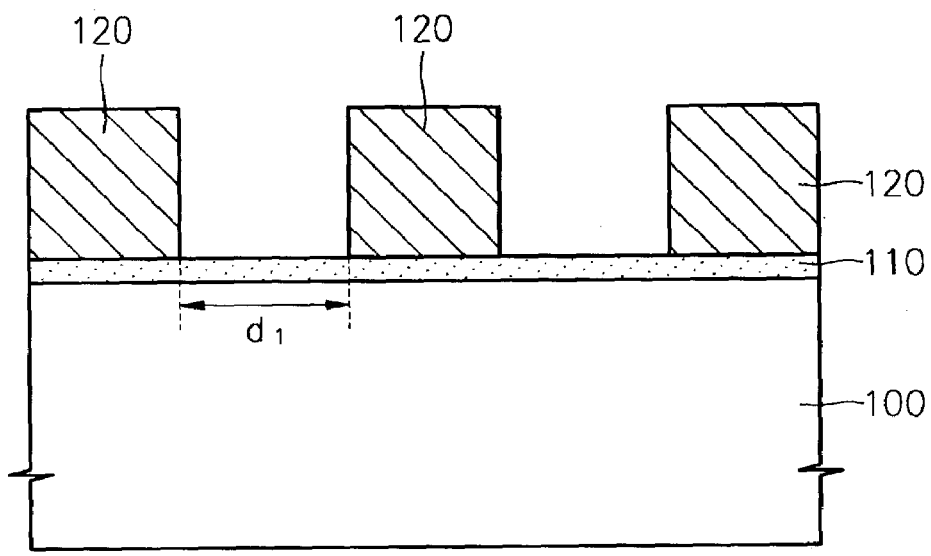
FIGS. 1 through 4 are schematic cross-sectional views illustrating a method for forming a fine pattern according to preferred embodiments of the present invention.

Hereinafter, embodiments of a method for forming a fine pattern of a semiconductor device according to the present invention will be described.

A photoresist layer is formed on a material layer, which is a target layer to be etched. The photoresist layer is exposed and developed to form a first resist pattern. The pattern may have a contact hole shape or a line and space shape. The photoresist layer may be formed of not only the presently used KrF resist, but also an ArF resist or an F2 resist. For example, to form a contact hole pattern having a critical dimension of 100 nm or less by using a KrF resist, a contact hole of the first resist pattern is preferably formed to have a diameter of about 140 nm to about 240 nm.

A flow control barrier layer is formed on the first resist pattern, i.e., on sidewalls and top of the first resist pattern, thereby forming a second resist pattern. The flow control barrier layer may control the amount of flow of the first resist pattern during a subsequent resist flow process. In the foregoing example, the contact hole of the second resist pattern is smaller in diameter than that of the first resist pattern.

The flow control barrier layer may be formed to a thickness of about 10 nm to about 100 nm, preferably about 30 nm to about 70 nm, for each profile of the resist pattern. The flow control barrier layer prevents the amount of flow from varying according to upper and lower positions within the resist pattern or according to a deviation of duty ratio, and it serves as a controller for minutely controlling the amount of flow.

Then, a resist flow process is performed, thus increasing the width of the photoresist. As a result, a third resist pattern having a pattern distance shorter than that of the second resist pattern is formed by the flowed photoresist and flow control barrier layer. In the foregoing example, a contact hole of the third resist pattern is formed to be smaller in diameter than that of the second resist pattern. Here, the contact hole of the third resist pattern may be adjusted to have a diameter of about 50 nm to about 90 nm.

The target layer is then etched by using the third resist pattern as an etch mask. Thus, a hyperfine pattern having a size of about 150 nm or less, more finely about 100 nm or less, can be formed.

The present embodiment can be applied to form a pattern having a critical dimension of about 120 nm or less, preferably about 100 nm or less, which would be difficult to form using conventional methods. In addition, because the present embodiment is effective in forming patterns having vertical profiles and in forming uniform patterns despite a deviation of duty ratio, the present invention can be applied also when the diameter of a contact hole may be sufficiently embodied using the conventional method.

In another embodiment of a method for forming a fine pattern of a semiconductor device according to the present invention, like the first embodiment, a first resist pattern is formed on a target layer to be etched. The first resist pattern may be a contact hole pattern or a line and space pattern. A material layer is formed of a high-molecular material that is soluble in a specific solvent on the target layer and the first resist pattern. For instance, the material layer may be formed of a material including a water-soluble high molecular material and a water-soluble crosslinking agent.

A flow control barrier layer is formed at an interface between the first resist pattern and the material layer. Here, the flow control barrier layer is insoluble in the specific solvent and may control flow of the first resist pattern during a subsequent resist flow process. Like the foregoing example, in the case that the material layer includes a water-soluble high-molecular material and a water-soluble crosslinking agent, the flow control barrier layer is preferably formed of a water-insoluble material into which the water-soluble crosslinking agent is transformed. The flow control barrier layer is preferably formed to a thickness of about 10 nm to about 100 nm, preferably about 30 nm to about 70 nm.

Next, the remaining material layer, which is not transformed into the flow control barrier layer, is removed using a solvent in which only the material layer is soluble. As a result, a second resist pattern is formed of the first resist pattern and the flow control barrier layer formed thereon. Like the foregoing example, when the material layer is one that is soluble in water and the flow control barrier layer is one that is insoluble in water, the solvent is preferably deionized water.

The resist flow process is performed in the same method as in the first embodiment. Thus, a third resist pattern, where the pattern distance (e.g., in the case of a contact hole pattern, the diameter of a contact hole) is shorter than that of the second resist pattern, is formed by the flowed resist and the flow control barrier layer. The distance between the third resist patterns is preferred to range from about 50 nm to about 150 nm. The target layer is then etched by using the third resist pattern as an etch mask. Thus, a fine pattern may be formed to have a size of about 150 nm or less, preferably about 100 nm or less.

Hereinafter, another embodiment of a method for forming a fine pattern of a semiconductor device according to the present invention will be described.

To begin with, a first resist pattern is formed on a target layer to be etched in the same method as in the first embodiment. Next, a water-soluble high-molecular material layer is formed on the target layer and first resist pattern. The material layer is baked to form a water-insoluble flow control barrier layer at an interface between the first resist pattern and the material layer. The remaining high-molecular material layer is removed using deionized water. The baking process is preferably carried out at a temperature of about 90° C. to about 150° C.

In addition to the foregoing steps, it is also possible to apply the method disclosed in U.S. Pat. No. 6,319,853, by Mitsubishi Denki Kabushiki Kaisha. For instance, a photoresist layer is formed on a target layer to be etched and then exposed and developed to form a first resist pattern. Then, acid radicals are generated in the first resist pattern. Next, a material layer is formed on the target layer and the first resist pattern. The material layer is formed of a material that does not dissolve the first resist pattern, but that can cause a crosslinking reaction with the acid radicals. A predetermined amount of heat is applied to the material layer, thereby causing a chemical reaction. Then, a crosslinking reaction layer is formed at an interface between the first resist pattern and the material layer. The remaining material layer is removed using a solvent that does not dissolve the crosslinking reaction layer and can remove the remaining non-reacted material layer, thereby forming a second resist pattern.

The method for forming fine patterns according to the foregoing U.S. Pat. No. 6,319,853 also proposes a method of forming fine patterns below the wavelength limit of exposure beams. However, that method has the following disadvantages.

First, while a crosslinking agent is added in order to form a crosslinking reaction layer, the crosslinking agent or the resulting particles may remain even after a rinse process for removing the remaining material layer is performed. The remaining crosslinking agent becomes unnecessary particles and may lead semiconductor devices to suffer from defects. In particular, the finer the patterns formed using this method, the more serious the problem becomes.

Second, it is not easy to uniformly form and minutely control the thickness of the crosslinking reaction layer. In particular, because the crosslinking reaction layer is formed to a thick thickness of 40 nm or higher according to U.S. Pat. No. 6,319,853, when hyperfine patterns having a critical dimension of 120 nm or less are formed, the crosslinking reaction layers on both sides come in direct contact with each other. As a result, a water-soluble layer is transformed into a water-insoluble layer in the wide region of the resist pattern and is not removed.

Third, in the case that the crosslinking reaction layer is formed to a thick thickness, like the conventional resist flow process, uniform patterns cannot be formed on the entire wafer. In other words, as the amount of acid radicals generated during the formation of the first resist pattern is different according to pattern density or duty ratio, the extent of the crosslinking reaction is different depending on pattern density or duty ratio. Also, the extent of the crosslinking reaction is different depending on pattern sizes. As a result, the thickness deviation of the crosslinking reaction layers becomes greater.

Accordingly, the foregoing method is unsuitable for forming a thick crosslinking reaction layer or forming a contact hole pattern to a diameter of 120 nm or less. Furthermore, after forming an appropriate size of pattern by using a KrF resist and then lessening pattern distances using resist flow process, it is impossible to use the method for forming finer patterns due to the foregoing problems.

In the method for forming fine patterns of the present invention, the foregoing method of U.S. Pat. No. 6,319,853 is preferably employed up to the step of forming the flow control barrier layer only when, as the result of forming the flow control barrier layer, the contact hole pattern is formed to a diameter of 100 nm or higher, preferably 120 nm or higher.

Back to the present embodiment, after removing the remaining high-molecular material layer, the resist flow process is performed. As a result, a third resist pattern, which includes a contact hole smaller than that of the second resist pattern, is formed of the flowed resist and the flow control barrier layer. The resist flow process is carried out at a temperature higher than a glass transition temperature of the flow control barrier layer by about 1° C. to about 50° C. For example, in the event that the flow control barrier layer is formed of the foregoing crosslinking reaction layer, the resist flow process is preferably conducted at about 120° C. to about 170° C.

Next, the target layer is etched by using the third resist pattern as an etch mask. Thus, a fine pattern can be formed to have a size of about 10 nm or less, preferably about 100 nm or less.

The foregoing embodiments of the present invention are applicable when hyperfine contact hole patterns are formed. However, as explained before, the present invention is not limited to a process of manufacturing contact hole patterns. The present invention may be applied to not only hole-type patterns, but also line and space-type patterns, for example. For another example, embodiments of the present invention can be adopted for forming very fine conductive line patterns at an interlayer dielectric layer using a damascene process.

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete and will fully convey the concept of the invention to those skilled in the art. In the drawings, the shape of elements is exaggerated for clarity, and the same reference numerals in different drawings represent the same element. Further, it will be understood that when a layer is referred to as being "on" another layer or substrate, it can be directly on the other layer or substrate, or intervening layers may also be present.

Referring to FIG. 1, an anti-reflective layer 10 is formed on a target layer 100. The target layer 100 may be a silicon semiconductor substrate or a predetermined material layer formed on a semiconductor substrate. For example, the target layer 100 may be a silicon oxide layer where a contact hole will be formed. Unless fine patterns are formed, a step of forming the anti-reflective layer 110 may be omitted.

Next, a KrF resist (SEPR-551, ShinEtsu Chem., for example) is coated on the target layer 100 or the anti-reflective layer 110 to a thickness of about 4700 Å. As stated above, it is also possible to use an ArF resist or F2 resist for a photoresist material, but the present embodiment adopts the KrF resist. In place of the exemplary SEPR-551 KrF resist, other kinds of KrF resists can be employed.

Thereafter, the resist layer is exposed to light at a dose of about 39 mJ/cm² by using KrF excimer laser in an exposure apparatus (NA=0.8, τ=0.85). The resist layer is developed to form a contact hole pattern having a critical dimension ($d_1$) of about 170 nm. Thus, a first resist pattern 120 is formed. Acid radicals (H⁺) remain in the first resist pattern 120 after the exposure and developing processes. In the present embodiment, the first resist pattern 120 is formed such that a duty ratio is 1:1.

Figure 2:
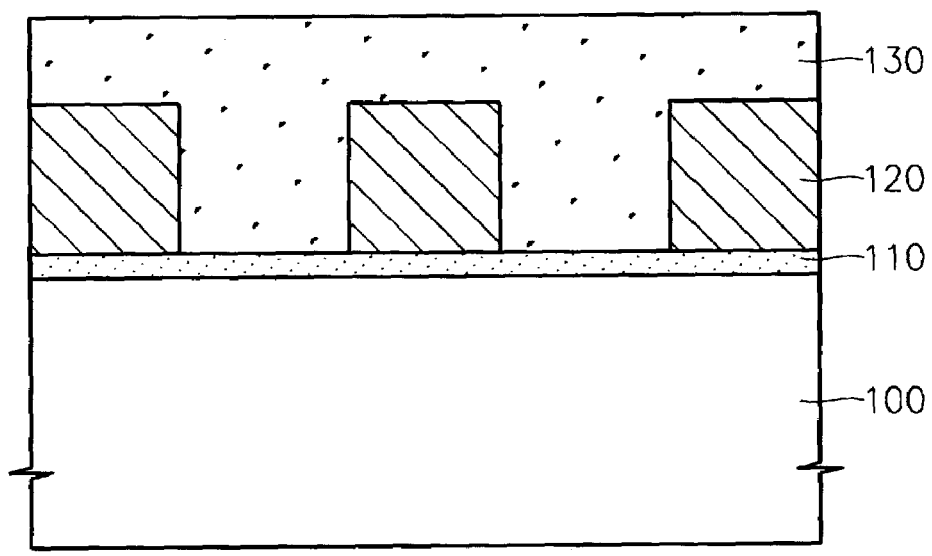
Figure 3:
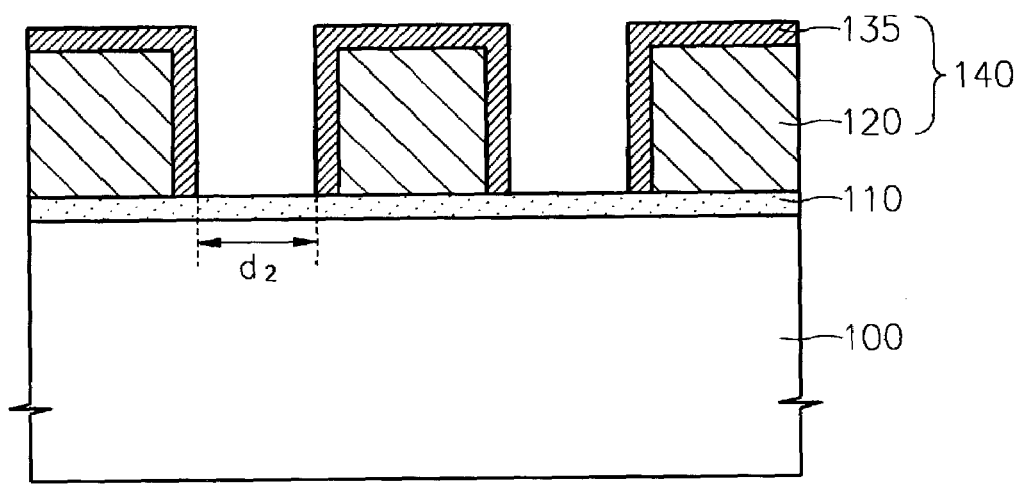

Next, a flow control barrier layer 135 is formed on the first resist pattern 120, thereby forming a second resist pattern 140. An embodiment of the step of forming the second resist pattern 140 is illustrated in FIGS. 2 and 3. The step shown in FIG. 2 is one embodiment of the method for forming the resultant structure of FIG. 3. The second resist pattern 140 may be formed by methods other than that shown in FIG. 2.

Referring to FIG. 2, a material layer 130 is formed to an appropriate thickness to completely cover the first resist pattern 120. The material layer 130 includes a water-soluble high-molecular material and a water-soluble crosslinking agent. For example, the material layer 130 may be formed of a material that causes a chemical reaction with acid radicals H⁺ and thus forms a water-insoluble crosslinking reaction layer. In the present embodiment, R500 (Clariant Chem.) is used for the material layer 130. After coating the material layer 130, a soft baking process is conducted at about 87° C. for about 70 seconds.

The resultant material layer is mixed and baked at about 100° C. for about 60 seconds. As a result, a crosslinking reaction layer is formed at an interface between the second resist pattern 120 and the material layer 130. The crosslinking reaction layer is the flow control barrier layer 135 that will be provided by the present invention. The thickness of the flow control barrier layer 135 may be controlled by adjusting the temperature and/or time of the baking. However, in view of the foregoing problems, the crosslinking reaction layer is preferably formed to have a thickness of about 30 nm to about 70 nm, preferably about 30 nm to about 50 nm. In the present embodiment, the flow control barrier layer 135, i.e., the crosslinking reaction layer, is formed to a thickness of about 35 nm.

A rinse process is performed using deionized water for about 60 seconds. The rinse process is required to remove the untransformed water-soluble high-molecular material as well as the non-reacted water-soluble crosslinking agent. After removing the water-soluble material, a post-exposure baking (PEB) process is carried out at about 100° C. for about 60 seconds.

Thus, as illustrated in FIG. 3, a second resist pattern 140, which includes the first resist pattern 120 and flow control barrier layer 135, is formed. After the foregoing processes, the distance $d_2$ between the second resist patterns 140, i.e., the diameter of the contact hole, is about 100 nm.

Figure 4:
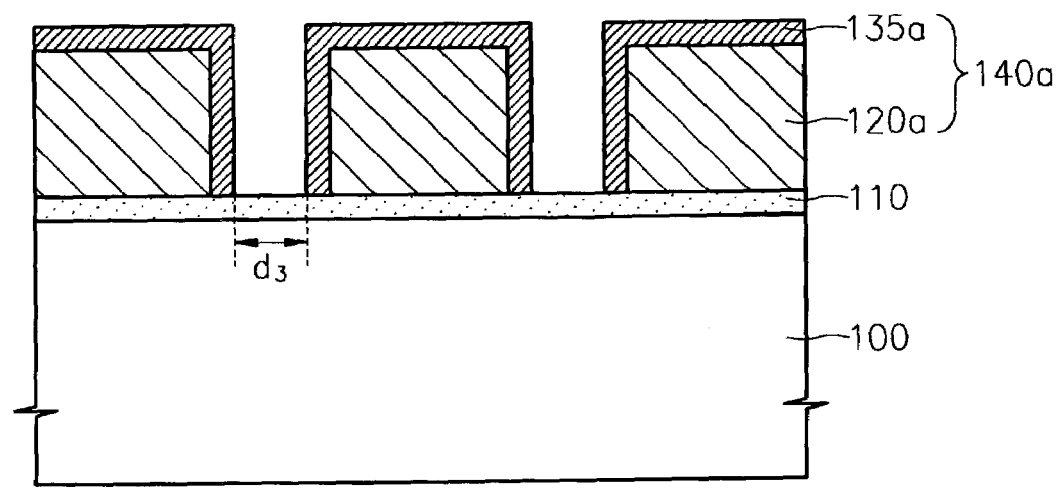

Referring to FIG. 4, a resist flow process is applied to the resultant structure of FIG. 3. For example, when an energy is supplied to the resultant structure, flow of the first resist pattern 120 formed of the photoresist material occurs. Here, the flow control barrier layer 135 serves as a controller for controlling the flow phenomenon to occur uniformly regardless of upper and lower positions or a duty ratio deviation of patterns. Also, even when a great amount of flow, for example, more than about 50 nm, is generated, the flow control barrier layer 135 prevents the bowing phenomenon.

In the present embodiment, the resist flow process is carried out at about 127° C. for about 60 seconds. As a result of the resist flow process, the distance between the first resist patterns 120a becomes shorter. Thus, the thickness and the size of the flow control barrier layer 135a are slightly changed, thereby forming a third resist pattern 140a. In the present embodiment, the distance $d_3$ between the third resist patterns, i.e., the diameter of the contact hole, is about 70 nm.

Under the same process conditions as the foregoing conditions, while only the temperature condition is varied, the distances $d_3$ between the third resist patterns, i.e., the diameters of the contact hole, are measured. The measurement results are shown in the following table.

TABLE 1

| Flow Temperature (° C.) | 125 | 127 | 129 | 132 |
|---|---|---|---|---|
| Size of Contact Hole ($d_3$, nm) | 80 | 70 | 60 | 50 |

As shown in Table 1, according to the present embodiment, the contact hole can be formed to have a critical dimension, i.e., the distance $d_3$ between the third resist patterns, of about 80 nm or less. Also, in the case of the process temperature of 132° C., it is possible to form the contact hole having a critical dimension of about 50 nm.

As mentioned above, the present embodiment is applicable even when patterns are formed to a size of over about 100 nm. In this case, the distance $d_1$ between the first resist patterns 120 is increased or the flow control barrier layer 135 is formed thinner at the beginning of the process. Alternatively, the amount of flow is reduced at the last step, i.e., the resist flow process. The target layer 100 (or the anti-reflective layer 110) is etched to form fine patterns having the desired size. According to embodiments of the present invention, a fine pattern having a smaller pattern distance than the exposure wavelength limit, for example, a contact hole pattern below the exposure wavelength limit, can be formed. In particular, a hyperfine pattern having a pattern distance of about 100 nm or less can be formed by using existing photoresist materials such as a KrF resist. According to the present invention, existing resists can still be utilized even if patterns become increasingly finer.

Also, the bowing phenomenon can be prevented during the resist flow process through embodiments of the present invention. Furthermore, the resist flow process can be controlled such that a deviation of the amount of flow is minimized on the entire wafer in spite of a deviation in duty ratio.

In addition, even when a pattern distance is very short, the crosslinking reaction layer can be uniformly formed and minutely controlled. Accordingly, the profile of a pattern can be uniform without causing it to block a space between resist patterns such as a contact hole.

While the present invention has been particularly shown and described with reference to preferred embodiments thereof, it will be understood by those of ordinary skill in the pertinent art that various changes in form and details may be made therein without departing from the spirit and scope of the present invention as defined by the following claims.

What is claimed is:

1. A method for forming a fine pattern of a semiconductor device, the method comprising:
    forming a photoresist layer on a target layer to be etched;
    exposing and developing the photoresist layer to form a first resist pattern;
    forming a movable flow control barrier layer on the first resist pattern so as to control flow of the first resist pattern during a subsequent resist flow process to form a second resist pattern;
    performing the resist flow process to form a third resist pattern having a pattern distance shorter than that of the second resist pattern; and
    etching the target layer by using the third resist pattern as an etch mask.

2. The method as claimed in claim 1, wherein the flow control barrier layer is formed to have a thickness of 10 nm to 100 nm.

3. The method as claimed in claim 1, wherein the photoresist layer is formed of one of KrF resist and ArF resist.

4. The method as claimed in claim 1, wherein the flow control barrier layer is substantially rigid in a plane and movable in a direction substantially perpendicular to the plane and substantially parallel to the target layer.

5. The method as claimed in claim 1, wherein the first, second, and third resist patterns are contact hole patterns, and the diameter of a contact hole of the third resist pattern is smaller than that of a contact hole of the second resist pattern.

6. The method as claimed in claim 5, wherein the first resist pattern is formed such that the diameter of a contact hole ranges from 140 nm to 240 nm.

7. A method for forming a fine pattern of a semiconductor device, the method comprising:
    forming a photoresist layer on a target layer to be etched;
    exposing and developing the photoresist layer to form a first resist pattern;
    forming a high-molecular material layer being soluble in a specific solvent on the target layer and the first resist pattern;
    forming a movable flow control barrier layer at an interface between the first resist pattern and the material layer, the flow control barrier layer insoluble in the specific solvent and for controlling the growth of the first resist pattern during a subsequent resist flow process;
    removing the remaining high-molecular material layer by using the specific solvent to form a second resist pattern;
    performing the resist flow process to form a third resist pattern having a pattern distance shorter than that of the second resist pattern; and
    etching the target layer by using the third resist pattern as an etch mask.

8. The method as claimed in claim 7, wherein the material layer is formed of a material including a water-soluble high-molecular material and a water-soluble crosslinking agent, and the flow control barrier layer is formed of a water-insoluble material.

9. The method as claimed in claim 7, wherein the flow control barrier layer is formed to have a thickness of 10 nm to 100 nm.

10. The method as claimed in claim 7, wherein the photoresist layer is formed of one of KrF resist and ArF resist.

11. The method as claimed in claim 7, wherein the first, second, and third resist patterns are contact hole patterns, and the diameter of a contact hole of the third resist pattern is smaller than that of a contact hole of the second resist pattern.

12. The method as claimed in claim 11, wherein the first resist pattern is formed such that the diameter of a contact hole ranges from 140 nm to 240 nm.

13. A method for forming a fine pattern of a semiconductor device, the method comprising:
    forming a photoresist layer on a target layer to be etched;
    exposing and developing the photoresist layer to form a first resist pattern;
    forming a water-soluble high-molecular material layer on the target layer and the first resist pattern;
    mixing and baking the material layer to form a movable flow control barrier layer that is insoluble in water and formed at an interface between the first resist pattern and the material layer;
    removing the remaining water-soluble high-molecular material layer by using water to form a second resist pattern;
    performing the resist flow process to form a third resist pattern having a pattern distance shorter than that of the second resist pattern; and
    etching the target layer by using the third resist pattern as an etch mask.

14. The method as claimed in claim 13, wherein the material layer is formed of a material including a water-soluble high-molecular material and a water-soluble crosslinking agent.

15. The method as claimed in claim 13, wherein the material layer is mixed and baked at a temperature of 90° C. to 150° C.

16. The method as claimed in claim 13, wherein the resist flow process is performed at a temperature higher than the glass transition temperature by about 1° C. to about 50° C.

17. The method as claimed in claim 13, wherein the photoresist layer is formed of one of KrF resist and ArF resist.

18. The method as claimed in claim 13, wherein the first, second, and third resist patterns, and the diameter of a contact hole of the third resist pattern is smaller than that of a contact hole of the second resist pattern.

19. The method as claimed in claim 18, wherein the first resist pattern is formed such that the diameter of a contact hole ranges from 140 nm to 240 nm.

20. The method as claimed in claim 13, wherein the flow control barrier layer is formed to have a thickness of 10 nm to 100 nm.

21. The method as claimed in claim 20, wherein the resist flow process is performed at a temperature of about 120° C. to about 170° C.

* * * * *